United States Patent
Motomura et al.

(10) Patent No.: US 7,841,081 B2
(45) Date of Patent: Nov. 30, 2010

(54) METHOD FOR MANUFACTURING ELECTRONIC PARTS MODULE

(75) Inventors: Koji Motomura, Saga (JP); Hideki Eifuku, Fukuoka (JP); Tadahiko Sakai, Fukuoka (JP)

(73) Assignee: Panasonic Corporation, Osaka (JP)

( * ) Notice: Subject to any disclaimer, the term of this patent is extended or adjusted under 35 U.S.C. 154(b) by 97 days.

(21) Appl. No.: 12/423,983

(22) Filed: Apr. 15, 2009

(65) Prior Publication Data

US 2009/0260230 A1 Oct. 22, 2009

(30) Foreign Application Priority Data

Apr. 16, 2008 (JP) .............................. 2008-106496

(51) Int. Cl.
H01R 43/00 (2006.01)
H05K 13/00 (2006.01)

(52) U.S. Cl. ............................. 29/856; 29/832; 29/842; 29/854; 29/855; 174/260; 228/44.7; 228/180.21; 228/180.22; 257/726; 257/727; 257/738; 438/108; 438/612; 438/613

(58) Field of Classification Search .................. 29/832, 29/840–842, 854–856; 174/260; 228/44.7, 228/180.21, 180.22; 257/726, 727, 737, 257/738, 778; 438/108, 612, 613
See application file for complete search history.

(56) References Cited

U.S. PATENT DOCUMENTS

| 6,158,115 | A | * | 12/2000 | Tsukagoshi et al. | ........... 29/832 |
| 6,479,757 | B1 | * | 11/2002 | Tsukagoshi et al. | ......... 174/259 |
| 6,841,022 | B2 | * | 1/2005 | Tsukagoshi et al. | ......... 156/230 |
| 2009/0097214 | A1 | * | 4/2009 | Lee et al. | ..................... 361/752 |

FOREIGN PATENT DOCUMENTS

| JP | 08104762 A | * | 4/1996 |
| JP | 2007047240 A | * | 2/2007 |
| JP | 2007-088009 | | 4/2007 |

* cited by examiner

*Primary Examiner*—Paul D Kim
(74) *Attorney, Agent, or Firm*—Pearne & Gordon LLP

(57) ABSTRACT

The manufacturing method for an electronic parts module includes forming an adhesive layer including solder particles on the circuit forming surface in range covering at least the first and the second land parts, positioning a terminal of the active element on the second land part, sticking the active element to the base wiring layer through the adhesive layer by heating and pressing the active element onto the base wiring layer with a thermally pressing tool, and releasing the heating and pressing with the thermally pressing tool while the adhesive layer is semi-solidified, thereafter positioning a terminal of the passive element on the first land part and sticking the passive element to the base wiring layer through the adhesive layer, and solidifying the adhesive layer and melting the solder particles by laminating and thermally pressing a thermosetting sheet onto the circuit forming surface to form the resin sealing layer.

4 Claims, 4 Drawing Sheets

METHOD FOR MANUFACTURING ELECTRONIC PARTS MODULE

BACKGROUND

The present invention relates to a method for manufacturing an electronic parts module that produces an electronic parts module having a structure in which electronic parts are mounted on a base wiring layer with a wiring pattern formed and the electronic parts and the wiring pattern are sealed by a sealing resin layer.

Electronic parts such as a semiconductor element are ordinarily incorporated in an electronic device in the form of an electronic parts module in which the electronic parts mounted on a base wiring layer such as a resin substrate are sealed by a resin. In accordance with a tendency that the high packaging density of the electronic parts module is required, as the electronic parts module, a form of what is called a parts incorporated printed wiring board is proposed in which the electronic parts are mounted on the inner layers of a plurality of laminated electrode patterns (for instance, JP-A-2007-88009). In an example disclosed in JP-A-2007-88009, an active element such as an IC chip and a passive element such as CR parts are mounted on the same base wiring layer.

However, when the active element and the passive element are mounted on the same base wiring layer, at the time of connecting these parts to the wiring layer, below-described difficulties arise. In mounting the electronic parts, a parts main body needs to be fixed to the base of the wiring layer and terminals of the parts need to be electrically connected to land parts of the wiring layer, however, the optimum connecting methods of the active element and the passive element are different from each other depending on their forms and characteristics. Therefore, when the parts are incorporated, it is necessary to individually mount the passive element and the active element. As a result, the manufacturing processes are complicated and therefore costly. The JP-A-2007-88009 discloses the example in which the active element and the passive element are mounted at the same time. However, in the JP-A-2007-88009, no concrete way how to connect the active element and the passive element to the wiring layer is disclosed. As described above, in the usual method for manufacturing a parts incorporated type electronic parts module, when the passive element and the active element are mounted on the same base wiring layer, the production process is complicated and the manufacturing cost is hardly reduced.

SUMMARY

Thus, it is an object of the present invention to provide a method for manufacturing an electronic parts module that can produce the electronic parts module having a structure that a passive element and an active element are mounted on the same base wiring layer by a simple production process.

A method for manufacturing an electronic parts module of the present invention produces an electronic parts module including a base wiring layer having a wiring pattern and a circuit forming surface, the wiring pattern formed on the circuit forming surface and including a first land part to which a passive element is connected and a second land part to which an active element is connected; and a resin sealing layer intimately formed on the circuit forming surface and sealing the passive element and the active element. The manufacturing method includes an adhesive layer forming process forming an adhesive layer including solder particles on the circuit forming surface in range covering at least the first land part and the second land part, an active element mounting process positioning a terminal of the active element on the second land part, sticking the active element to the base wiring layer through the adhesive layer by heating and pressing the active element onto the base wiring layer with a thermally pressing tool, and releasing the heating and pressing with the thermally pressing tool while the adhesive layer is semi-solidified, a passive element mounting process, after the active element mounting process, positioning a terminal of the passive element on the first land part and sticking the passive element to the base wiring layer through the adhesive layer, a pressing process solidifying the adhesive layer and melting the solder particles by laminating and thermally pressing a thermosetting sheet onto the circuit forming surface so as to form the resin sealing layer.

According to the present invention, when the electronic parts module that includes the passive element and the active element mounted on the same base wiring layer is produced, the production processes are employed in which the adhesive layer including the solder particles is formed on the circuit forming surface of the base wiring layer, the active element is previously mounted on the base wiring layer and thermally pressed, then, the passive element is mounted on and stuck to the base wiring layer, and then, the thermosetting sheet for forming the sealing resin layer is laminated to the circuit forming surface to which the passive element and the active element are stuck and thermally pressed to solidify the adhesive layer and melt the solder particles included in the adhesive layer at the same time. Thus, the electronic parts module having the structure that the passive element and the active element are mounted on the same base wiring layer can be produced by the simple production processes.

PREFERRED EMBODIMENT

Figure 2A:
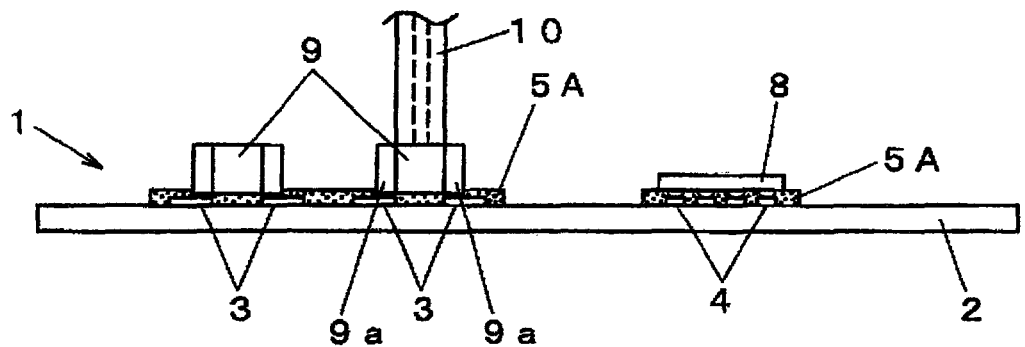
FIGS. 2A to 2C are process explanatory views showing the method for producing the electronic parts module of the one embodiment of the present invention.
Figure 2B:
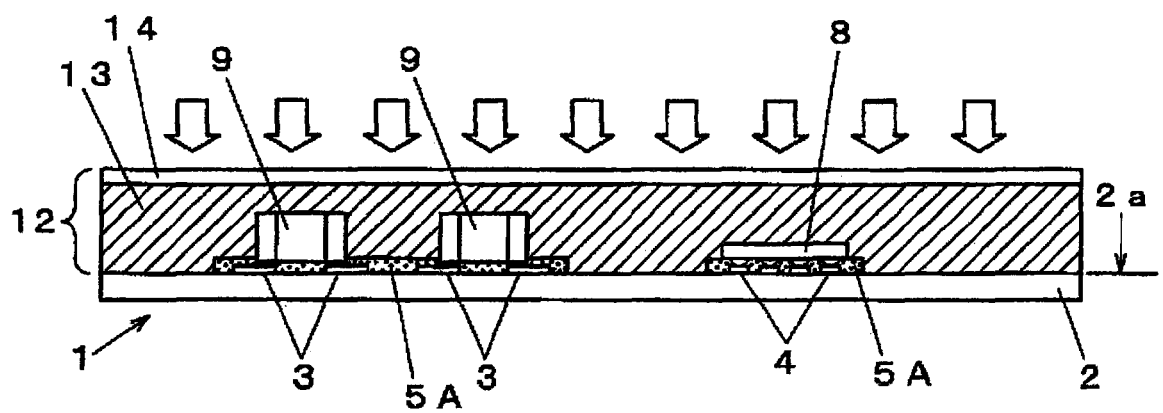
Figure 2C:
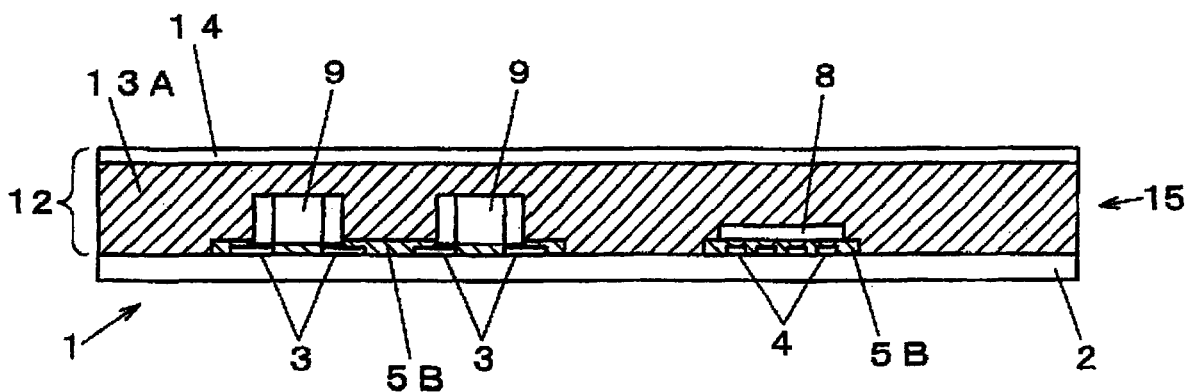
Figure 3A:
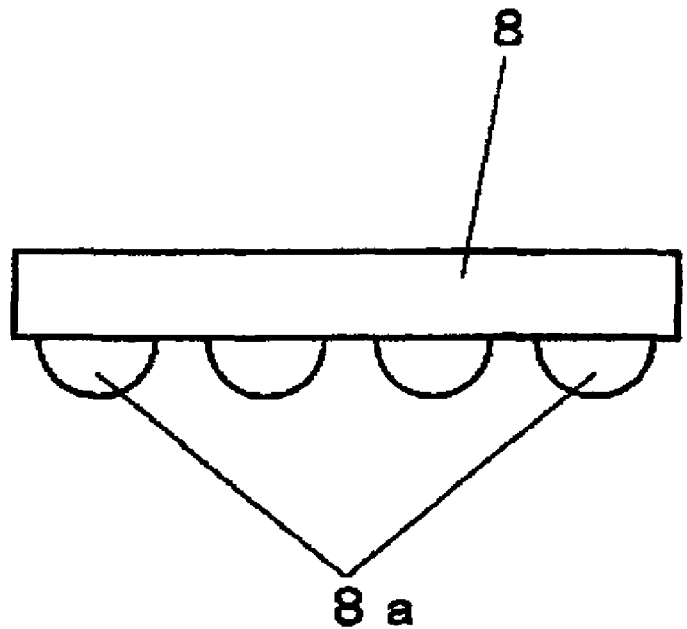
FIGS. 3A and 3B are structure explanatory views of a passive element and an active element mounted on the electronic parts module of the one embodiment of the present invention.
Figure 3B:
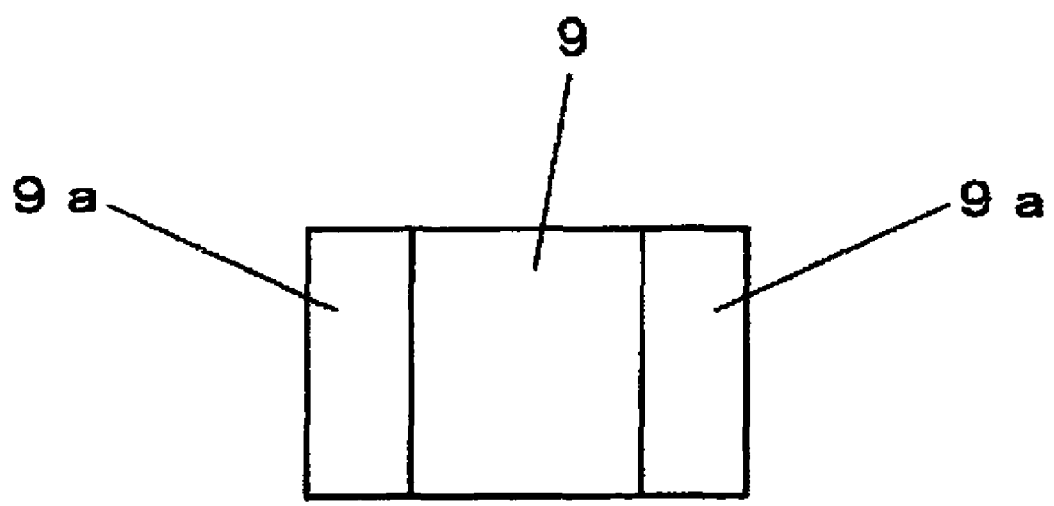
Figure 4A:
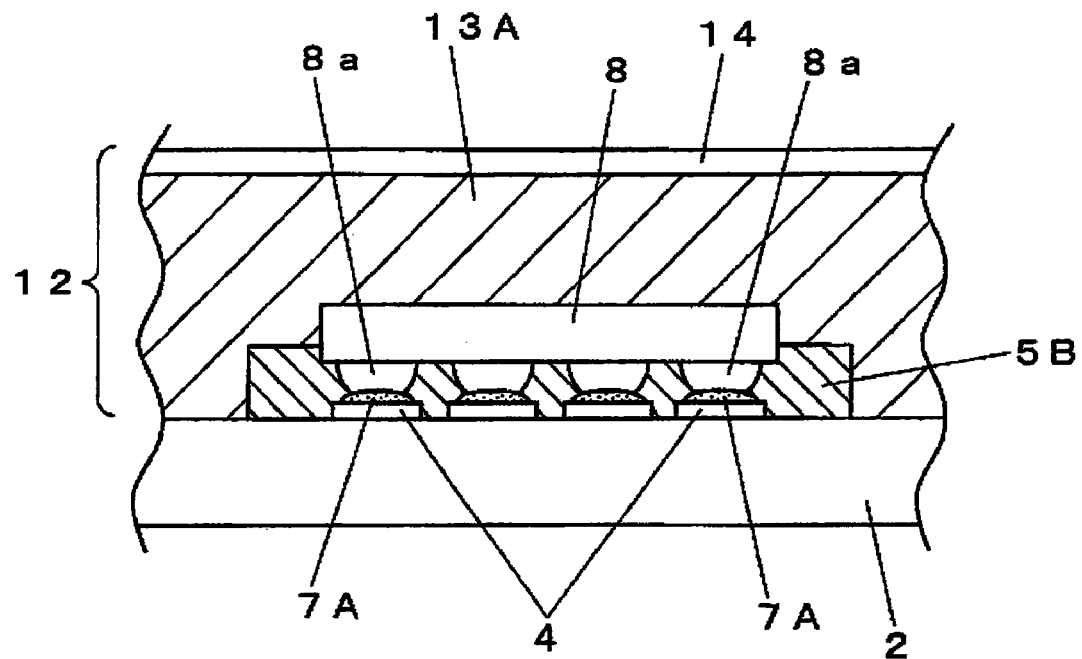
FIGS. 4A and 4B are explanatory views of connecting states of the passive element and the active element in the electronic parts module of the one embodiment of the present invention.
Figure 4B:
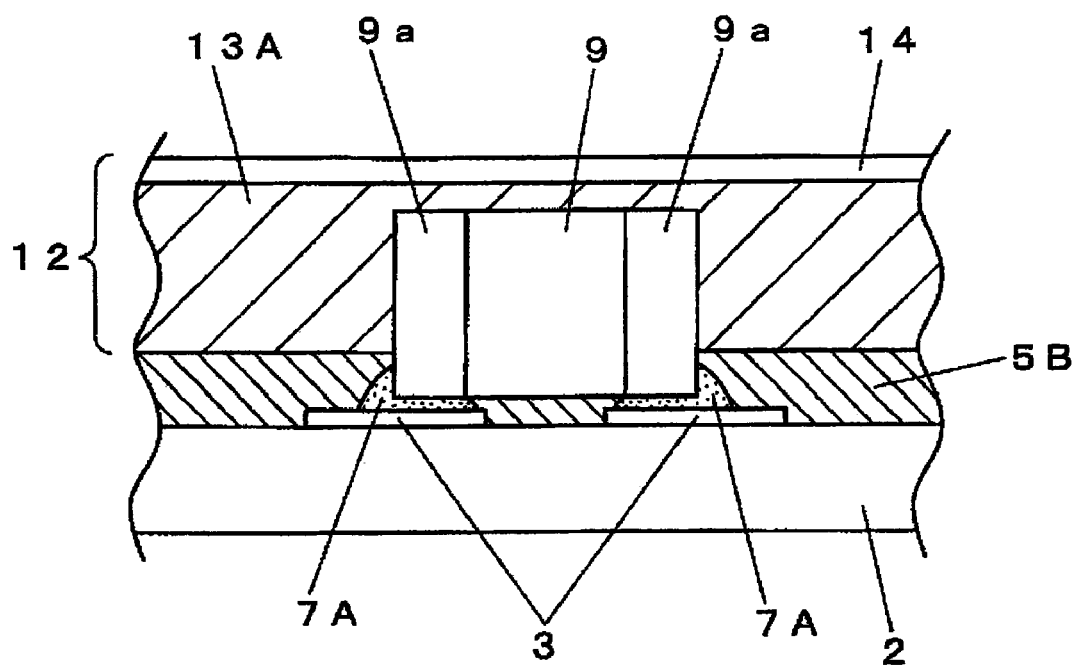

Now, an embodiment of the present invention will be described by referring to the drawings. FIGS. 1A to 1D and FIGS. 2A to 2C are process explanatory views showing a method for producing an electronic parts module of one embodiment of the present invention. FIGS. 3A and 3B are explanatory views of structures of a passive element and an active element mounted on the electronic parts module of the one embodiment of the present invention. FIGS. 4A and 4B are explanatory views of connecting states of the passive element and the active element in the electronic parts module of the one embodiment of the present invention.

Initially, a method for producing the electronic parts module will be described. FIGS. 1A to 1D and FIGS. 2A to 2C show the method for producing the electronic parts module in order of processes, which is formed by mounting the passive element represented by CR parts (FIG. 3B) such as a capacitor, a resistance, etc. and the active element such as an IC chip (FIG. 3A) with a bump on the same base wiring layer having a wiring pattern formed on a circuit forming surface.

Figure 1A:
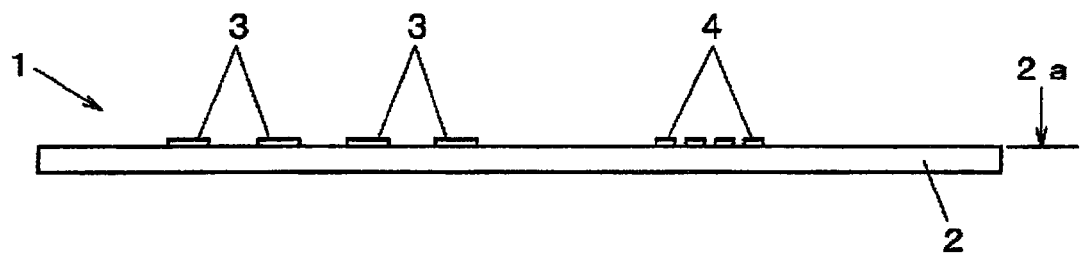
FIGS. 1A to 1D are process explanatory views showing a method for producing an electronic parts module of one embodiment of the present invention.

FIG. 1A shows a base wiring layer 1 serving as a base part of the electronic parts module. On a circuit forming surface 2a in an upper surface side of a resin substrate 2 forming the base wiring layer 1, a wiring pattern having a first land part 3 and a second land part 4 is formed. In the electronic parts module, under a state that a terminal of the passive element is electrically connected to the first land part 3 and a terminal of the active element is electrically connected to the second land part 4 respectively, the passive element and the active element are mounted on the base wiring layer 1, and the passive element and the active element are sealed by a sealing resin layer (see a sealing resin layer 13A shown in FIG. 2C) formed so as to come into close contact with the circuit forming surface 2a of the base wiring layer 1.

Figure 1B:
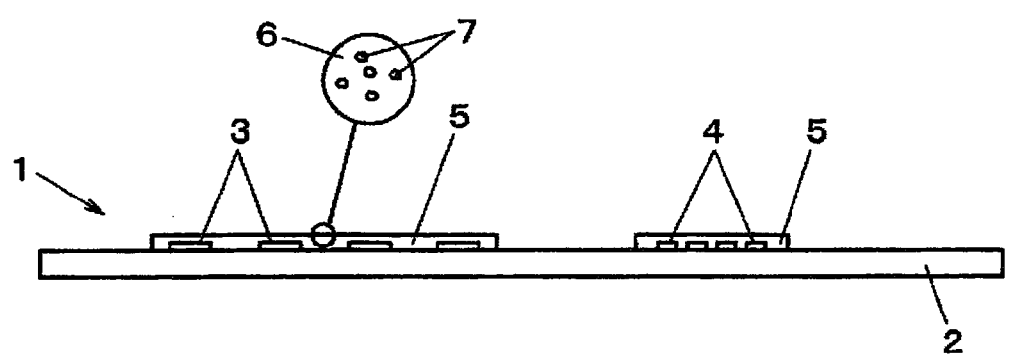

Then, an adhesive layer for connecting parts is formed on the circuit forming surface 2a of the resin substrate 2. Namely, as shown in FIG. 1B, a liquid resin adhesive 5 is provided in ranges that cover the first land part 3 and the second land part 4 on the circuit forming surface 2a by a method of a screen printing or an application by a dispenser. The resin adhesive 5 has a thermosetting resin 6 as a liquid adhesive having an activating function for removing a solder oxide film that includes solder particles 7. As the solder particles 7, for instance, the solder particles having a composition of SnBi58 and a melting point temperature of about 139° C. are used. As the thermosetting resin 6, for instance, an epoxy resin, an acrylate resin, polyimide, polyurethane and phenol resins, and an unsaturated polyester resin are employed.

After that, the base wiring layer 1 on which the resin adhesive 5 is arranged is transferred to a curing device and heated under a prescribed heating condition. Thus, the thermosetting reaction of the thermosetting resin 6 in the resin adhesive 5 arranged on the circuit forming surface 2a progresses. At this time, the thermosetting resin 6 is not completely solidified by controlling a heating to stop the thermosetting reaction halfway. Thus, the thermosetting resin 6 becomes a thermosetting resin 6A in a gel state so that a semi-solidified adhesive layer 5A is formed. The thermosetting resin 6 is semi-solidified or half solidified in order to increase an adhesive power by the resin adhesive 5 and hold the parts such as the passive element or the active element on the base wiring layer 1 in a stable way in a parts mounting process as a post-process. Here, on the circuit forming surface 2a, the adhesive layers are formed only in the ranges that cover the first land part 3 and the second land part 4. It is to be understood that the adhesive layer 5A may be formed in all the range of the circuit forming surface 2a, however, the adhesive layer is desirably limited to the ranges that cover at least the first land part 3 and the second land part 4 in view of saving resources and reducing a cost.

Figure 1C:
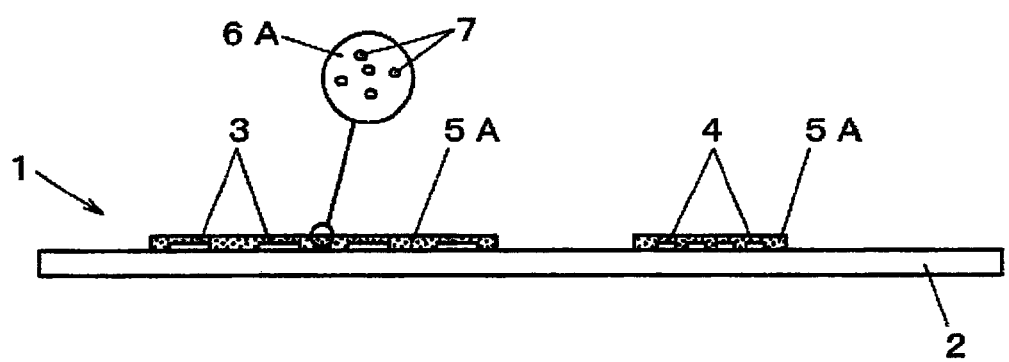

Namely, a process illustrated in FIGS. 1B and 1C show adhesive layer forming processes that forms the adhesive layer 5A including the solder particles 7 in the ranges that cover at least the first land part 3 and the second land part 4 on the upper surface of the base wiring layer 1. Further, in an example shown in this embodiment, the adhesive layer forming process includes an adhesive arranging process (FIG. 1C) that arranges the liquid adhesive 5 including the solder particles 7 at least on the first land part 3 and the second land part 4 and a semi-solidifying or a half solidifying process (FIG. 1C) that semi-solidifies or half solidifies the arranged adhesive 5.

In stead of the process forming the adhesive layer by semi-solidification of the liquid resin adhesive 5 after arranging the liquid resin adhesive 5 on the circuit forming surface 2a, a sheet like adhesive which is formed from the thermosetting resin 6 including the solder particles 7 by semi-solidification may be used.

In this case, the sheet type adhesive of a size corresponding to that of the adhesive layer 5A formed in FIG. 1C) is prepared, laminated to and arranged on the circuit forming surface 2a, so that the adhesive layer similar to the adhesive layer 5A is formed. That is, in this example, the sheet type adhesive including the solder particles is arranged at least on the first land part 3 and the second land part 4 in the adhesive layer forming process.

Then, the parts are mounted on the base wiring layer. In mounting the parts, an IC chip 8 having bumps and CR parts 9 such as a capacitor, a resistance, etc. shown in FIG. 3 are mounted on the resin substrate 2. The IC chip 8 is the active element and a plurality of metal bumps 8a as terminals for connection are formed on a lower surface of the IC chip 8. The arrangement of the second land parts 4 in the resin substrate 2 corresponds to the arrangement of the metal bumps 8a in the IC chip 8. The metal bump 8a may be formed with a solder or other metals. In either case, a melting point of the metal bump 8a is higher than a heating temperature of a below-described pressing process. The CR part 9 is the passive element and has terminal electrodes 9a as terminals for connection formed at both ends.

Figure 1D:
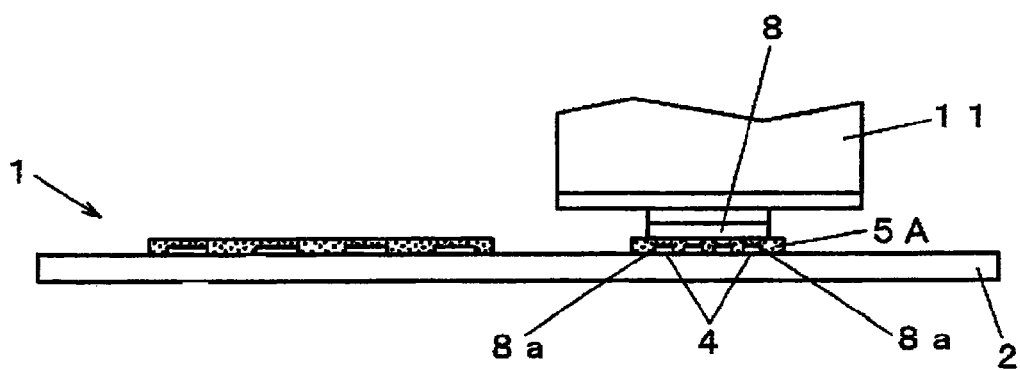

In this embodiment, initially, the IC chip 8 as the active element is previously mounted on the base wiring layer and thermally pressed. That is, as shown in FIG. 1D, the IC chip 8 held by a thermally pressing tool 11 is pressed to the base wiring layer 1 to press the metal bumps 8a to the second land parts 4 and melt the solder particles 7 in the adhesive layer 5A in contact with the metal bumps 8a by heating the IC chip 8 through the thermally pressing tool 11. Thus, a large quantity of the solder is allowed to be stuck to the metal bumps 8a as much as possible before a connection by the solder in the below-described pressing process, so that a reliability of the connection can be improved.

At this time, the process conditions are set so that pressurizing and heating operations by the thermally pressing tool 11 are released while the thermosetting resin 6A forming the adhesive layer 5A is still semi-solidified. Thus, in the below-described pressing process in a post-process, when the solder particles 7 in the adhesive layer 5A are molten to connect the metal bumps 8a to the second land parts 4 by the solder, the thermosetting resin 6A still maintains its semi-solidified state and the fluidity of the molten solder in which the solder particles 7 are molten is not prevented by the thermosetting resin 6A. Accordingly, an inconvenience can be prevented such as an inferior form of a solder connection part due to restriction of the fluidity of the molten solder by the already solidified thermosetting resin.

After the active element thermally pressing process, the passive element is mounted on the base wiring layer. Namely, as shown in FIG. 2A, then CR part 9 is held by an adsorption nozzle 10 and the terminal electrodes 9a of the CR parts 9 are positioned to the land parts 3 to mount the CR parts 9 on the base wiring layer 1 and stick the CR parts 9 thereto through the adhesive layer 5A (a passive element mounting process). Thus, the CR parts 9 and the IC chip 8 are respectively held by the first land parts 3 and the second land parts 4 of the base wiring layer 1 by an adhesive holding force of the adhesive layer 5A in the semi-solidified state.

After that, the base wiring layer 1 is transferred to the pressing process. In the pressing process, as shown in FIG.

2B, a thermosetting sheet 12 is laminated to the base wiring layer 1 and thermally pressed by a pressing device having a heater. The thermosetting sheet 12 has a structure that a copper film 14 is laminated to a prepreg 13. In this thermally pressing process, the thermosetting sheet 12 is pressurized under a pressure of about 30 kg/cm$^2$ by the pressing device and heated at a temperature of about 150° C. to 200° C. The heating temperature at this time is set so as to be higher than the melting point temperature of the solder particles 7 in the adhesive layer 5A. A resin with which the prepreg 13 is impregnated is temporarily softened and flows by the heating operation so as to enclose the IC chip 8 or the CR parts 9 from their peripheries. The pressurizing and heating operations are continuously carried out for a prescribed time to thermally solidify the prepreg 13 as shown in FIG. 2C, so that a sealing resin layer 13A is formed that seals the IC chip 8 or the CR parts 9 on the circuit forming surface 2a of the resin substrate 2.

In the pressurizing and heating operations, the solder particles 7 molten in the vicinity of the metal bumps 8a of the IC chip 8 in the adhesive layer 5A that covers the second land parts 4 wet the second land parts 4 and the metal bumps 8a and coagulate. These molten solder particles are cooled and solidified to form solder connecting parts 7A for connecting the second land parts 4 to the metal bumps 8a as shown in FIG. 4A. Further, the thermosetting reaction of the thermosetting resin 6A of the adhesive layer 5A in the semi-solidified state is further advanced by the heating operation so that a resin reinforcing part 5B is formed for enclosing and reinforcing the solder connecting parts 7A of the metal bumps 8a and the second land parts 4 from their peripheries. Further, in the CR parts 9, the solder particles 7 molten in the vicinity of the terminal electrodes 9a of the CR parts 9 in the adhesive layer 5A that covers the first land parts 3 wet the first land parts 3 and the terminal electrodes 9a and coagulate in the fillet forms. These molten solder particles are cooled and solidified to form solder connecting parts 7A for connecting the first land parts 3 to the terminal electrodes 9a as shown in FIG. 4B. Further, the thermosetting reaction of the thermosetting resin 6A of the adhesive layer 5A in the semi-solidified state is further advanced by the heating operation so that a resin reinforcing part 5B is formed for covering and reinforcing the solder connecting parts 7A of the terminal electrodes 9a and the first land parts 3.

Namely, in the above-described pressing process, the thermosetting sheet 12 is laminated and thermally pressed on the circuit forming surface 2a of the resin substrate 2 of the base wiring layer 1 on which the IC chip 8 and the CR parts 9 adhere. The thermosetting sheet 12 forms the sealing resin layer which seals the IC chip 8 and the CR parts 9 on the circuit forming surface 2a of the resin substrate 2 of the base wiring layer 1. Thus, the adhesive layer 5A is solidified and the solder particles 7 included in the adhesive layer 5A are molten at the same, so that the above-described solder connecting parts 7A and the resin reinforcing part 5B are formed.

Thus, the electronic parts module 15 is completed in which the terminal electrodes 9a of the CR parts 9 are electrically connected to the first land parts 3 and the metal bumps 8a of the IC chip 8 are electrically connected to the second land parts 4 respectively and the CR parts 9 and the IC chip 8 are respectively mounted on the base wiring layer 1 on which a wiring pattern is formed that includes the first land parts 3 for connecting the CR parts 9 and the second land parts 4 for connecting the IC chip 8 to the circuit forming surface 2a, and the CR parts 9 and the IC chip 8 are sealed by the sealing resin layer 13A formed so as to come into close contact with the circuit forming surface 2a.

As described above, in the method for producing the electronic parts module 15 shown in the embodiment, when the electronic parts module 15 is produced that includes the CR parts 9 as the passive element and the IC chip 8 as the active element mounted on the same base wiring layer 1, such production processes are employed that the adhesive layer 5A including the solder particles 7 is formed on the circuit forming surface 2a of the base wiring layer 1, the IC chip 8 is previously mounted on the base wiring layer 1 and thermally pressed, then, the CR parts 9 is mounted on and stuck to the base wiring layer 1 by the adhesive layer 5A, and then, the thermosetting sheet 12 for forming the sealing resin layer is stuck to the circuit forming surface 2a of the base wiring layer 1 to which the CR parts 9 and the IC chip 8 are stuck and thermally pressed to solidify the adhesive layer 5A and melt the solder particles 7 included in the adhesive layer 5A at the same time. Thus, the electronic parts module having the structure that the passive element and the active element are mounted on the same base wiring layer can be produced by the simple production processes.

In the structure that the passive element and the active element are mounted on the same base wiring layer 1 as in this embodiment, since processes for mounting the passive element and the active element or tools employed for mounting the passive element and the active element are different from each other, it is necessary to determine which of the passive element and the active element is to be previously mounted. In this embodiment, as described above, an order of processes is that the active element is mounted on the base wiring layer and thermally pressed before the passive element is mounted. Thus, an inconvenience occurring when the passive element is previously mounted on the base wiring layer can be avoided.

Namely, when the active element is mounted on the base wiring layer, the heating operation is desirably carried out by the thermally pressing tool. However, when the passive element is previously mounted on the base wiring layer, at the time of mounting the active element afterward, the thermally pressing tool interferes with the passive element existing as the parts already mounted on the base wiring layer and possibly breaks the parts or displace the passive element. Further, when the passive element is previously mounted on the base wiring layer and the connection by the solder are completed before the active element is mounted on the base wiring layer, the resin substrate of the base wiring layer may be deformed by heating during the solder connection and the displacement of the wiring pattern for connecting the active element may arise due to the deformation. As compared therewith, as shown in this embodiment, the active element is previously mounted on the base wiring layer and thermally pressed, so that the above-described inconveniences can be prevented.

The method for producing the electronic parts module of the present invention can advantageously produce the electronic parts module having the structure that the passive element and the active element are mounted on the same base wiring layer by the simple production processes and is useful for a production field of an electronic parts module formed by laminating a plurality of wiring layers.

What is claimed is:

1. A method for manufacturing an electronic parts module, the electronic parts module comprising a base wiring layer having a wiring pattern and a circuit forming surface, the wiring pattern formed on the circuit forming surface and including a first land part to which a passive element is connected and a second land part to which an active element is connected; and a resin sealing layer intimately formed on the circuit forming surface and sealing the passive element and the active element, comprising:

an adhesive layer forming process for forming an adhesive layer including solder particles on the circuit forming surface in range covering at least the first land part and the second land part;

an active element mounting process for positioning a terminal of the active element on the second land part, sticking the active element to the base wiring layer through the adhesive layer by heating and pressing the active element onto the base wiring layer with a thermally pressing tool, and releasing the heating and pressing with the thermally pressing tool while the adhesive layer is semi-solidified;

a passive element mounting process, after the active element mounting process, for positioning a terminal of the passive element on the first land part and sticking the passive element to the base wiring layer through the adhesive layer; and a pressing process for solidifying the adhesive layer and melting the solder particles by laminating and thermally pressing a thermosetting sheet onto the circuit forming surface so as to form the resin sealing layer.

2. The method according to claim 1, wherein the adhesive layer forming process includes steps of:

arranging liquid adhesive including the solder particles on at least the first land part and the second land part, and semi-solidifying the arranged liquid adhesive.

3. The method according to claim 1, wherein the adhesive layer forming process includes step of: arranging a sheet type adhesive including solders particle on at least the first land part and the second land part.

4. The method according to claim 1, wherein the solidification of the adhesive layer and melting of the solder particles are performed at the same time.

* * * * *